(12) United States Patent
Komo

(10) Patent No.: US 12,463,107 B2
(45) Date of Patent: Nov. 4, 2025

(54) SEMICONDUCTOR PACKAGE

(71) Applicant: Mitsubishi Electric Corporation, Tokyo (JP)

(72) Inventor: Hideo Komo, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 379 days.

(21) Appl. No.: 17/597,733

(22) PCT Filed: Dec. 10, 2019

(86) PCT No.: PCT/JP2019/048331
§ 371 (c)(1),
(2) Date: Jan. 20, 2022

(87) PCT Pub. No.: WO2021/117145
PCT Pub. Date: Jun. 17, 2021

(65) Prior Publication Data
US 2022/0262700 A1 Aug. 18, 2022

(51) Int. Cl.
H01L 23/367 (2006.01)
H01L 23/31 (2006.01)

(52) U.S. Cl.
CPC ...... *H01L 23/3672* (2013.01); *H01L 23/3107* (2013.01)

(58) Field of Classification Search
CPC ............ H01L 23/3114; H01L 23/3672; H01L 23/3142; H01L 23/3107; H01L 23/295;
(Continued)

(56) References Cited

U.S. PATENT DOCUMENTS

2012/0091573 A1\* 4/2012 Sasaki .................. H01L 23/473
257/E23.08
2012/0313252 A1\* 12/2012 Ueda .................. H01L 23/3121
257/773

(Continued)

FOREIGN PATENT DOCUMENTS

CN 102446875 A 5/2012
CN 102820271 A 12/2012
(Continued)

OTHER PUBLICATIONS

English Machine Translation of JP-2014183058-A with paragraph numbers.*

(Continued)

*Primary Examiner* — Julio J Maldonado
*Assistant Examiner* — Nathan Pridemore
(74) *Attorney, Agent, or Firm* — Studebaker Brackett PLLC

(57) ABSTRACT

A heat spreader (3) is provided on an upper surface of a cooling plate (1) with an insulating layer (2) interposed therebetween. A semiconductor chip (4) is provided on the heat spreader (3). Mold resin (10) seals the upper surface of the cooling plate (1), the heat spreader (3), and the semiconductor chip (4). The insulating layer (2) does not protrude from the heat spreader (3) to a side of the heat spreader (3). A groove (11) is provided on the upper surface of the cooling plate (1) below a peripheral portion of the heat spreader (3). The insulating layer (2) is provided to overhang the groove (11).

15 Claims, 6 Drawing Sheets

(58) Field of Classification Search
CPC ........... H01L 23/3121; H01L 23/49562; H01L 23/36; H01L 23/4334; H01L 2224/33181; H01L 2924/181; H01L 25/07; H01L 25/18; F28F 2275/025
See application file for complete search history.

(56) References Cited

U.S. PATENT DOCUMENTS

| | | | | |
|---|---|---|---|---|
| 2014/0353814 | A1* | 12/2014 | Sakamoto | H01L 23/367 |
| | | | | 438/122 |
| 2016/0351480 | A1* | 12/2016 | Fushie | H01L 23/562 |
| 2017/0178995 | A1* | 6/2017 | Hino | H01L 25/18 |
| 2017/0309540 | A1* | 10/2017 | Temmei | H01L 23/367 |
| 2017/0338189 | A1* | 11/2017 | Soda | H01L 23/3672 |
| 2021/0066235 | A1* | 3/2021 | Oomori | H01L 25/07 |

FOREIGN PATENT DOCUMENTS

| | | |
|---|---|---|
| CN | 106165089 A | 11/2016 |
| CN | 107004644 A | 8/2017 |
| JP | 2014183058 A * | 9/2014 |

OTHER PUBLICATIONS

International Search Report issued in PCT/JP2019/048331; mailed Mar. 10, 2020.

An Office Action mailed by China National Intellectual Property Administration on Aug. 2, 2024, which corresponds to Chinese Patent Application No. 201980102718.2 and is related to U.S. Appl. No. 17/597,733; with English language translation.

An Office Action; mailed by the China National Intellectual Property Administration of the People's Republic of China on Jan. 26, 2025, which corresponds to Chinese Patent Application No. 201980102718.2 and is related to U.S. Appl. No. 17/597,733.

* cited by examiner

SEMICONDUCTOR PACKAGE

FIELD

The present invention relates to a semiconductor package used for power control equipment or the like.

BACKGROUND

A semiconductor package in which a heat spreader is provided on a cooling plate with an insulating layer interposed therebetween has been used. Conventionally, to ensure an insulation distance between the cooling plate and the heat spreader, the area of the insulating layer has been increased so that the insulating layer protrudes from the heat spreader to the side thereof (see, e.g., PTL 1).

CITATION LIST

Patent Literature

[PTL 1] JP 2014-183058 A

SUMMARY

Technical Problem

As the area of the insulating layer increases, the area of the cooling plate also increases. Accordingly, there has been a problem that the size of the semiconductor package increases.

The present invention has been made to solve the above-described problem, and is directed to obtaining a semiconductor package the size of which can be reduced while ensuring insulation.

Solution to Problem

A semiconductor package according to the present disclosure includes: a cooling plate; a heat spreader provided on an upper surface of the cooling plate with an insulating layer interposed therebetween; a semiconductor chip provided on the heat spreader; and mold resin sealing the upper surface of the cooling plate, the heat spreader, and the semiconductor chip, wherein the insulating layer does not protrude from the heat spreader to a side of the heat spreader, a groove is provided on the upper surface of the cooling plate below a peripheral portion of the heat spreader, and the insulating layer is provided to overhang the groove.

Advantageous Effects of Invention

In the present disclosure, the insulating layer does not protrude from the heat spreader to the side thereof. Thus, the area of the cooling plate need not be increased. The groove is provided on the upper surface of the cooling plate below the peripheral portion of the heat spreader. The insulating layer is provided to overhang the groove. As a result, an insulation distance between the cooling plate and the heat spreader can be ensured. Therefore, the size of the semiconductor package can be reduced while ensuring insulation.

DESCRIPTION OF EMBODIMENTS

A semiconductor package according to the embodiments of the present disclosure will be described with reference to the drawings. The same components will be denoted by the same symbols, and the repeated description thereof may be omitted.

Embodiment 1

Figure 1:
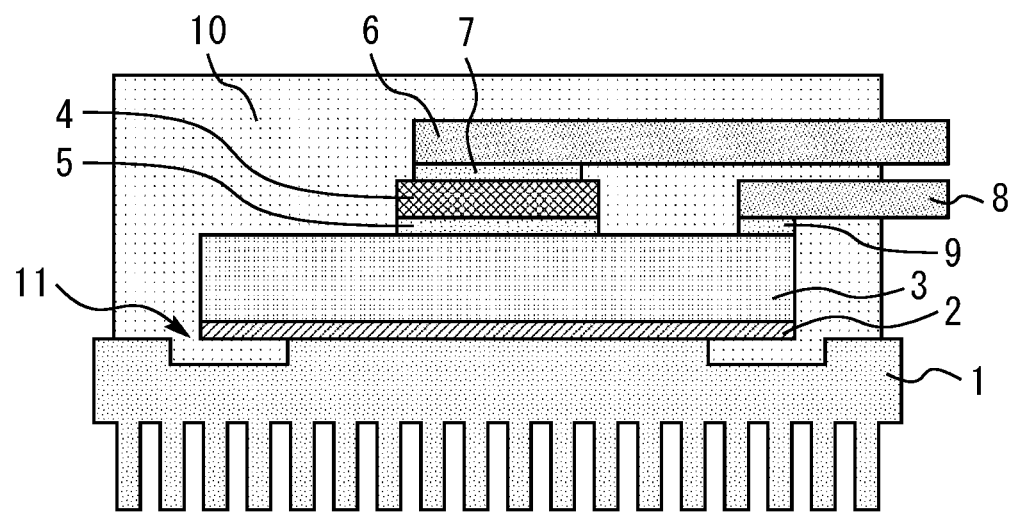
FIG. 1 is a cross-sectional view illustrating a semiconductor package according to an embodiment 1.

FIG. 1 is a cross-sectional view illustrating a semiconductor package according to an embodiment 1. A cooling plate 1 is of a pin fin type having a plurality of heat dissipation fins on its lower surface side. The cooling plate 1 is composed of a metal such as copper or aluminum. A heat spreader 3 is provided on an upper surface of the cooling plate 1 with an insulating layer 2 interposed therebetween. The heat spreader 3 is composed of a metal such as copper, and has conductivity. The insulating layer 2 is epoxy resin filled with a filler. The thickness of the insulating layer 2 is approximately 0.15 mm to 0.2 mm.

A semiconductor chip 4 is provided on the heat spreader 3. The semiconductor chip 4 is an IGBT, a MOSFET, or a diode. A lower surface electrode of the semiconductor chip 4 is bonded to the heat spreader 3 with a solder 5. Heat generated by the semiconductor chip 4 is transmitted to the cooling plate 1 through the solder 5, the heat spreader 3, and the insulating layer 2.

A lead 6 is bonded to an upper surface electrode of the semiconductor chip 4 with a solder 7. A lead 8 is bonded to the heat spreader 3 with a solder 9. Mold resin 10 seals the upper surface of the cooling plate 1, the heat spreader 3, the semiconductor chip 4, and respective parts of the leads 6 and 8. The mold resin 10 is epoxy resin. A groove 11 of the cooling plate 1 is filled with the mold resin 10.

The heat spreader 3 is an insulating layer integrated heat spreader. An outer shape of the insulating layer 2 and an outer shape of the heat spreader 3 are the same in a planar view. That is, the area of the insulating layer 2 is the same as the area of the heat spreader 3. Accordingly, the insulating layer 2 does not protrude from the heat spreader 3 to the side thereof.

The groove 11 is provided on the upper surface of the cooling plate 1 below a peripheral portion of the heat spreader 3. The depth of the groove 11 is approximately 0.5 mm to 1.0 mm. The width of the groove 11 is approximately 2.0 mm to 3.0 mm. The insulating layer 2 is provided to overhang the groove 11. A length in which the insulating layer 2 overhangs the groove 11 is approximately 1.0 mm to 1.5 mm.

Figure 2:
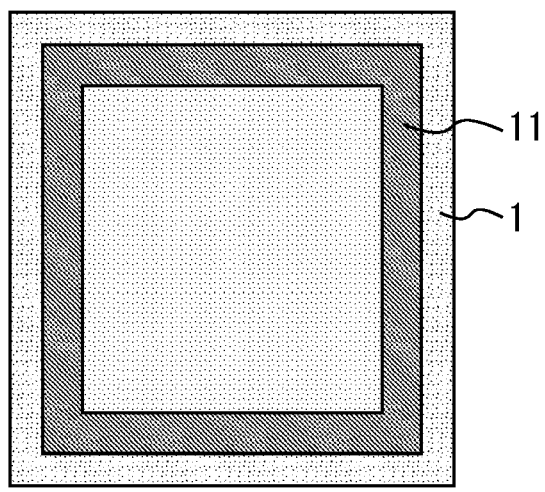
FIG. 2 is a plan view illustrating the upper surface of the cooling plate.
Figure 3:
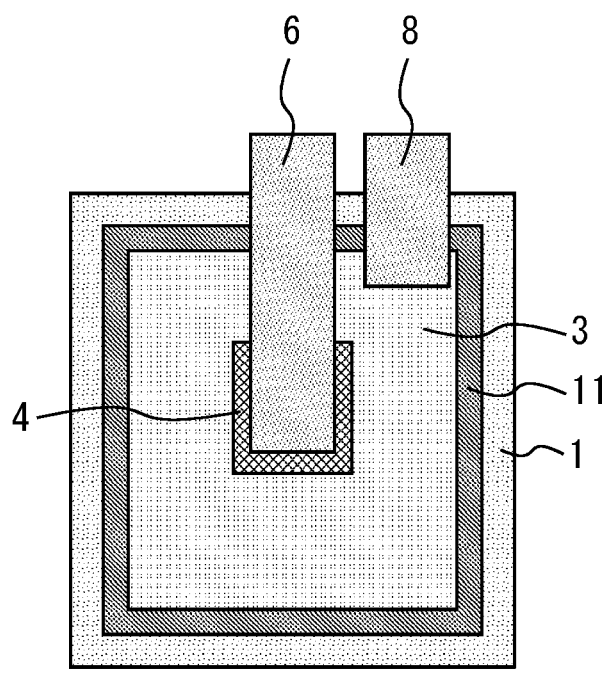
FIG. 3 is a plan view illustrating a state where the heat spreader or the like is provided on the cooling plate.

FIG. 2 is a plan view illustrating the upper surface of the cooling plate. FIG. 3 is a plan view illustrating a state where the heat spreader or the like is provided on the cooling plate. The groove 11 is provided in a square frame shape to surround the whole periphery of the heat spreader 3. The groove 11 may be provided to surround only a part of the heat spreader 3.

Figure 4:
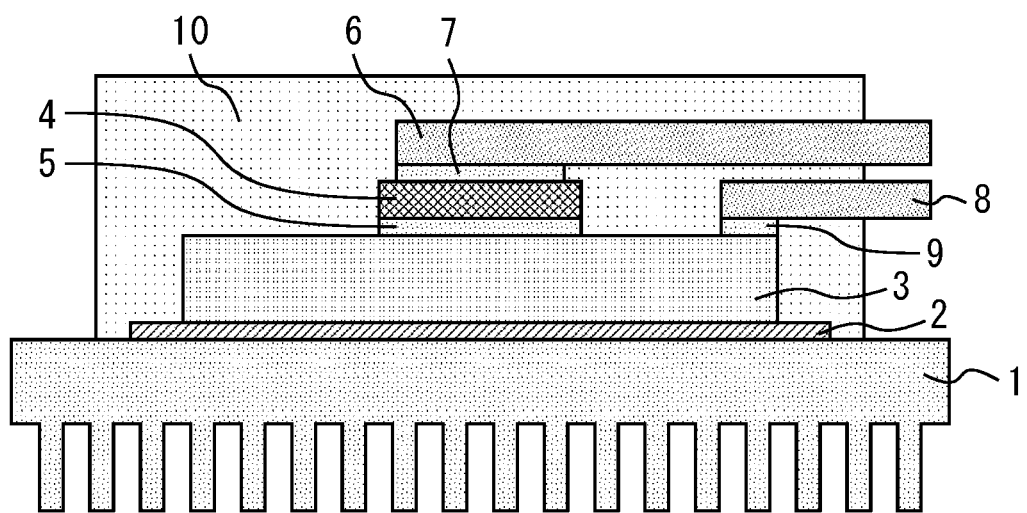
FIG. 4 is a cross-sectional view illustrating a semiconductor package according to the comparative example.

Then, effects of the present embodiment will be described in comparison with those in a comparative example. FIG. 4 is a cross-sectional view illustrating a semiconductor package according to the comparative example. In the comparative example, a groove 11 is not provided on an upper surface of a cooling plate 1. Therefore, to ensure an insulation distance between the cooling plate 1 and a heat spreader 3, the area of an insulating layer 2 is increased so that the insulating layer 2 protrudes from the heat spreader 3 to the side thereof. Accordingly, the area of the cooling plate 1 increases, thereby presenting a problem that the size of the semiconductor package increases.

On the other hand, in the present embodiment, the insulating layer 2 does not protrude from the heat spreader 3 to the side thereof. Therefore, the area of the insulating layer 2 is small. Thus, the area of the cooling plate 1 need not be increased. The groove 11 is provided on the upper surface of the cooling plate 1 below the peripheral portion of the heat spreader 3. The insulating layer 2 is provided to overhang the groove 11. As a result, an insulation distance between the cooling plate 1 and the heat spreader 3 can be ensured. Therefore, the size of the semiconductor package can be reduced while ensuring insulation.

Embodiment 2

Figure 5:
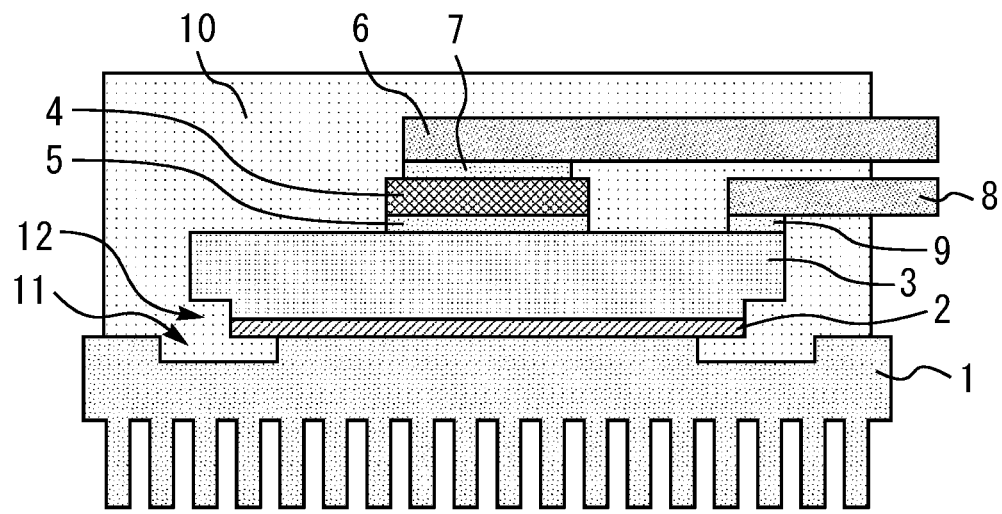
FIG. 5 is a cross-sectional view illustrating a semiconductor package according to an embodiment 2.

FIG. 5 is a cross-sectional view illustrating a semiconductor package according to an embodiment 2. A notch 12 is provided on a side surface of a heat spreader 3. When the notch 12 is used, the heat spreader 3 is easy to convey at the time of manufacture. Other configurations and effects are similar to those in the embodiment 1.

Embodiment 3

Figure 6:
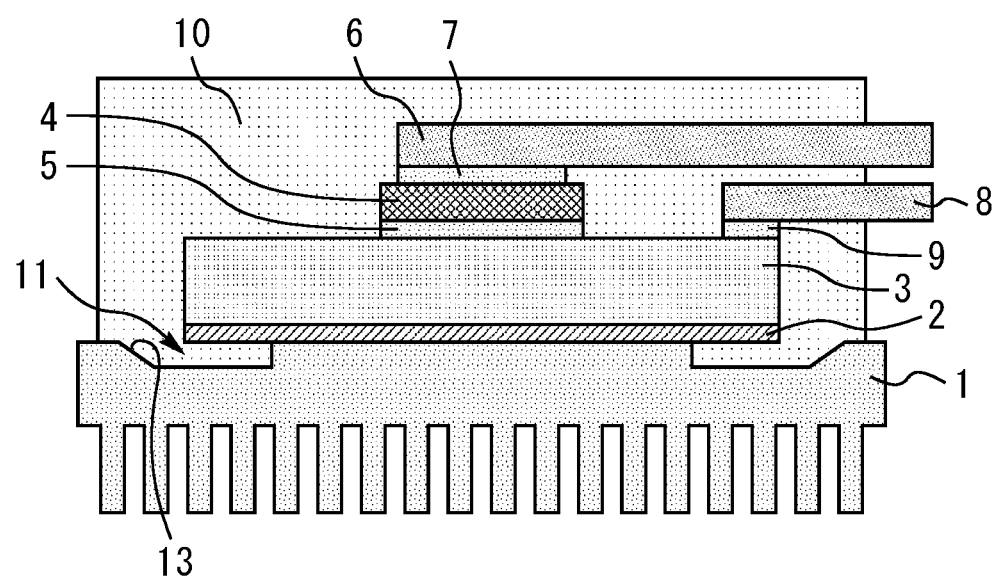
FIG. 6 is a cross-sectional view illustrating a semiconductor package according to an embodiment 3.

FIG. 6 is a cross-sectional view illustrating a semiconductor package according to an embodiment 3. A taper 13 inclined toward the center of a cooling plate 1 is provided on an outer side surface of a groove 11. During resin sealing, mold resin 10 is injected from the upper side of the taper 13. The mold resin 10 flows along the taper 13. Thus, the mold resin 10 easily enters the groove 11. Other configurations and effects are similar to those in the embodiment 1.

Embodiment 4

Figure 7:
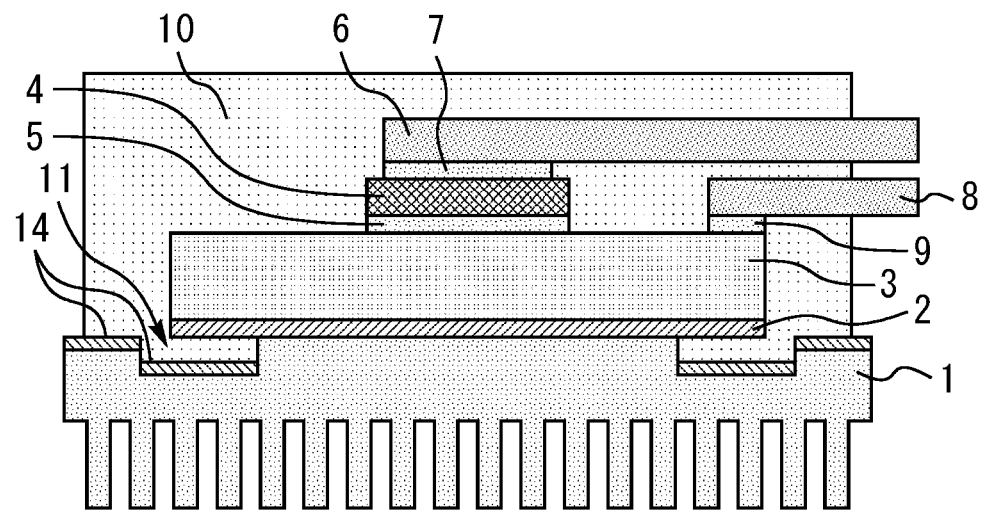
FIG. 7 is a cross-sectional view illustrating a semiconductor package according to an embodiment 4.

FIG. 7 is a cross-sectional view illustrating a semiconductor package according to an embodiment 4. A dimple 14 is provided in a region other than a contact surface with an insulating layer 2 on an upper surface of a cooling plate 1. The depth of the dimple 14 is approximately 0.1 mm, and the size thereof is approximately ϕ0.25 mm. When the dimple 14 is provided, adhesion between the cooling plate 1 and mold resin 10 is improved. When the dimple 14 is not provided on the contact surface with the insulating layer 2, a heat dissipation property can be ensured. The dimple 14 may be provided in only a groove 11. Other configurations and effects are similar to those in the embodiment 1.

Embodiment 5

Figure 8:
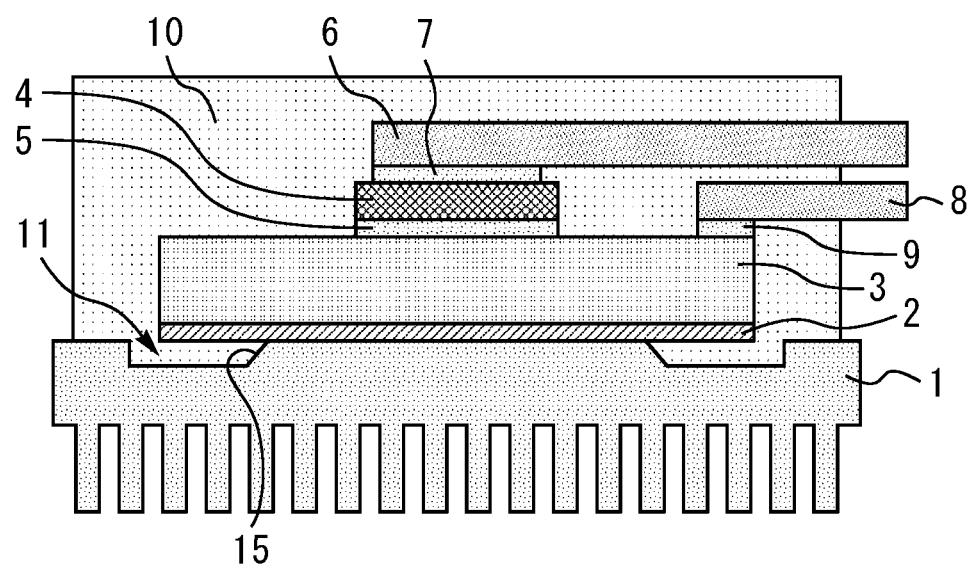
FIG. 8 is a cross-sectional view illustrating a semiconductor package according to an embodiment 5.
Figure 9:
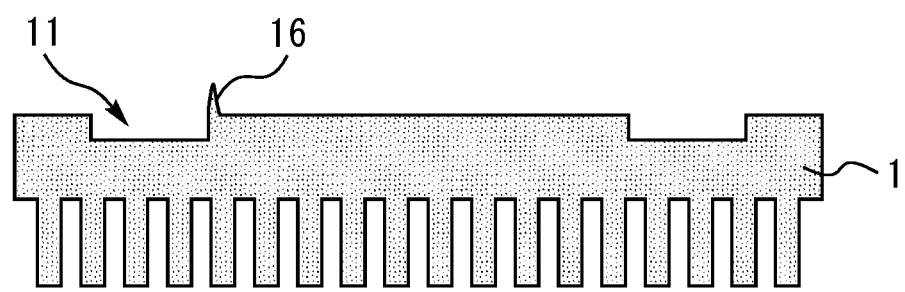
FIG. 9 is a cross-sectional view illustrating a cooling plate having a groove with no taper.

FIG. 8 is a cross-sectional view illustrating a semiconductor package according to an embodiment 5. A taper 15 is provided on an inner side surface of a groove 11. FIG. 9 is a cross-sectional view illustrating a cooling plate having a groove with no taper. If the groove 11 with no taper 15 is formed by cutting, a burr 16 may occur at an end of the groove 11. An inner portion of the groove 11 is a mounting portion of an insulating layer 2 and a heat spreader 3. Thus, the presence of the burr 16 prevents mounting. On the other hand, when the taper 15 is provided on the inner side surface of the groove 11, the burr 16 can be prevented from occurring in the mounting portion. Other configurations and effects are similar to those in the embodiment 1.

Embodiment 6

Figure 10:
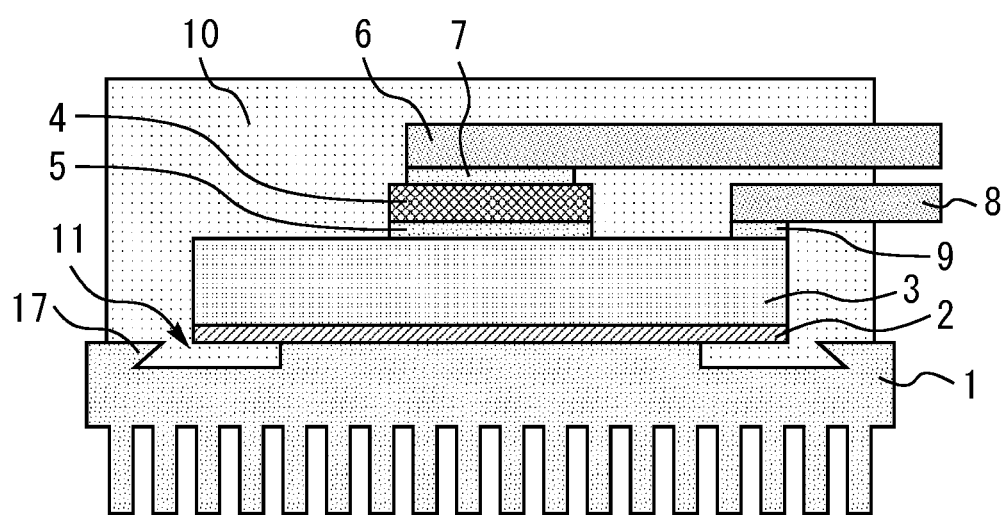
FIG. 10 is a cross-sectional view illustrating a semiconductor package according to an embodiment 6.

FIG. 10 is a cross-sectional view illustrating a semiconductor package according to an embodiment 6. A reverse-tapered anchor structure 17 inclined toward the center of a cooling plate 1 is provided on an outer side surface of a groove 11. When mold resin 10 enters a gap in the anchor structure 17, adhesion between the cooling plate 1 and the mold resin 10 is improved. Other configurations and effects are similar to those in the embodiment 1.

Embodiment 7

Figure 11:
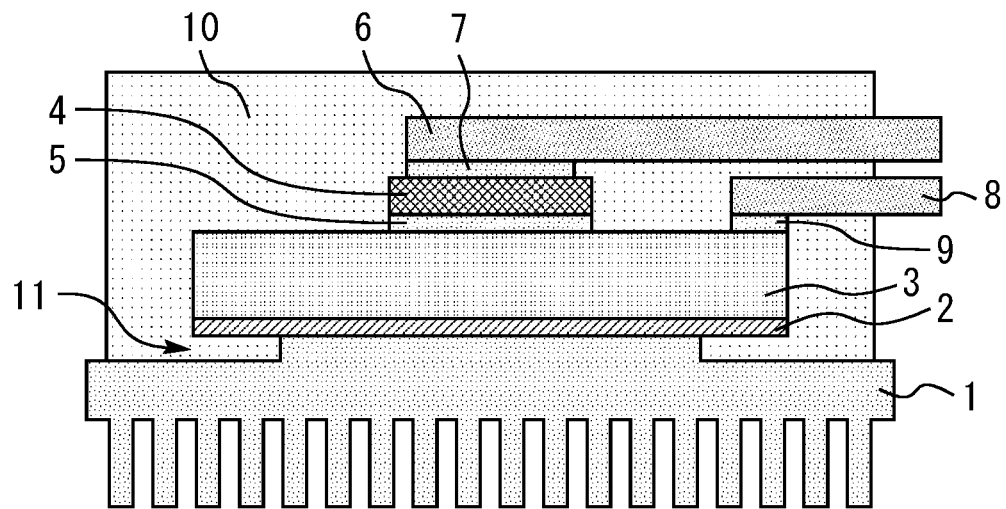
FIG. 11 is a cross-sectional view illustrating a semiconductor package according to an embodiment 7.

FIG. 11 is a cross-sectional view illustrating a semiconductor package according to an embodiment 7. A groove 11 extends to an outer end portion of a cooling plate 1. Accordingly, only a mounting portion of an insulating layer 2 and a heat spreader 3 protrudes on an upper surface of the cooling plate 1 so that the cooling plate 1 has a simple stepped structure. When the structure of the cooling plate 1 is simplified, a process for manufacturing the cooling plate 1 can be simplified. Other configurations and effects are similar to those in the embodiment 1.

Embodiment 8

Figure 12:
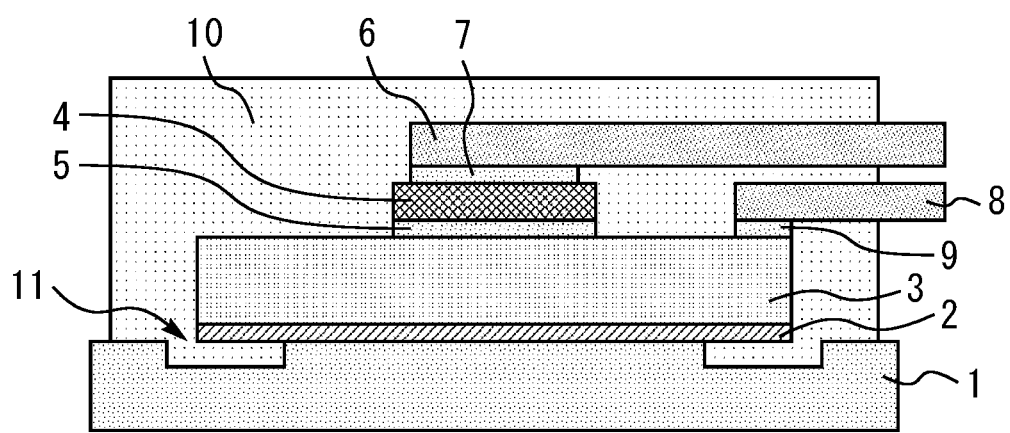
FIG. 12 is a cross-sectional view illustrating a semiconductor package according to an embodiment 8.

FIG. 12 is a cross-sectional view illustrating a semiconductor package according to an embodiment 8. Although each of the respective cooling plates 1 in the embodiments 1 to 7 is of a pin fin type, a cooling plate 1 in the present embodiment is a base plate having no heat dissipation fin. In this case, similar effects to those in the embodiment 1 can also be obtained.

The semiconductor chip 4 is not limited to a semiconductor chip formed of silicon, but instead may be formed of a wide-bandgap semiconductor having a bandgap wider than that of silicon. The wide-bandgap semiconductor is, for example, a silicon carbide, a gallium-nitride-based material, or diamond. A power semiconductor chip formed of such a wide-bandgap semiconductor has a high voltage resistance and a high allowable current density, and thus can be miniaturized. The use of such a miniaturized semiconductor chip enables the miniaturization and high integration of the semiconductor module in which the semiconductor chip is incorporated. Further, since the semiconductor chip has a high heat resistance, a radiation fin of a heatsink can be miniaturized and a water-cooled part can be air-cooled, which leads to further miniaturization of the semiconductor module. Further, since the semiconductor chip has a low power loss and a high efficiency, a highly efficient semiconductor module can be achieved.

REFERENCE SIGNS LIST

1 cooling plate; 2 insulating layer; 3 heat spreader; 4 semiconductor chip, 10 mold resin; 11 groove; 12 notch; 13 taper; 14 dimple; 15 taper; 17 anchor structure

The invention claimed is:

1. A semiconductor package comprising:
    a cooling plate;
    a heat spreader provided on an upper surface of the cooling plate with an insulating layer interposed therebetween;
    a semiconductor chip provided on the heat spreader; and
    mold resin sealing the upper surface of the cooling plate, the heat spreader, and the semiconductor chip,
    wherein the insulating layer does not protrude from the heat spreader to any side of the heat spreader,
    a groove is provided on the upper surface of the cooling plate below a peripheral portion of the heat spreader and spaced entirely radially inward from a peripheral side of the cooling plate, the groove including an outer side surface and an inner side surface positioned radially inward from the outer side surface, and
    the insulating layer is provided to overhang the groove.

2. The semiconductor package according to claim 1, wherein a notch is provided on a side surface of the heat spreader.

3. The semiconductor package according to claim 1, wherein a taper is provided on the outer side surface of the groove.

4. The semiconductor package according to claim 1, wherein
    a dimple is provided in a region other than a contact surface with the insulating layer on the upper surface of the cooling plate.

5. The semiconductor package according to claim 1, wherein a taper is provided on the inner side surface of the groove.

6. The semiconductor package according to claim 1, wherein an anchor structure is provided on the outer side surface of the groove.

7. The semiconductor package according to claim 1, wherein the cooling plate is a base plate.

8. The semiconductor package according to claim 1, wherein the semiconductor chip is formed of a wide-band-gap semiconductor.

9. The semiconductor package according to claim 4, wherein a plurality of dimples including the dimple are provided in the region other than a contact surface with the insulating layer on the upper surface of the cooling plate.

10. The semiconductor package according to claim 1, wherein side surfaces of the insulating layer are flush with side surfaces of the heat spreader.

11. The semiconductor package according to claim 10, wherein the side surfaces of the heat spreader that are flush with the side surfaces of the insulating layer directly contact a lowest surface of the heat spreader.

12. The semiconductor package according to claim 1, wherein an area of the insulating layer in plan view is equal to an area of the heat spreader in plan view.

13. The semiconductor package according to claim 1, wherein an outer shape of the insulating layer in plan view is the same as an outer shape of the heat spreader in plan view.

14. The semiconductor package according to claim 10, wherein an outer shape of the insulating layer in plan view is the same as an outer shape of the heat spreader in plan view.

15. The semiconductor package according to claim 12, wherein an outer shape of the insulating layer in plan view is the same as an outer shape of the heat spreader in plan view.

\* \* \* \* \*